US009513989B2

(12) United States Patent
Chen et al.

(10) Patent No.: US 9,513,989 B2
(45) Date of Patent: Dec. 6, 2016

(54) PRIORI INFORMATION BASED POST-PROCESSING IN LOW-DENSITY PARITY-CHECK CODE DECODERS

(71) Applicant: LSI Corporation, San Jose, CA (US)

(72) Inventors: Zhengang Chen, San Jose, CA (US); Abdel-Hakim S. Alhussien, San Jose, CA (US); Erich F. Haratsch, Bethlehem, PA (US)

(73) Assignee: Seagate Technology LLC, Cupertino, CA (US)

( * ) Notice: Subject to any disclaimer, the term of this patent is extended or adjusted under 35 U.S.C. 154(b) by 49 days.

(21) Appl. No.: 13/860,068

(22) Filed: Apr. 10, 2013

(65) Prior Publication Data

US 2014/0298131 A1 Oct. 2, 2014

Related U.S. Application Data

(60) Provisional application No. 61/805,195, filed on Mar. 26, 2013.

(51) Int. Cl.
*H03M 13/00* (2006.01)
*G06F 11/10* (2006.01)
*H03M 13/11* (2006.01)

(52) U.S. Cl.
CPC ...... *G06F 11/1012* (2013.01); *H03M 13/1108* (2013.01)

(58) Field of Classification Search
CPC ... H03M 13/09; H03M 13/091; H04L 1/0061; H04L 1/0057; H04L 1/0045
USPC ............................................. 714/758
See application file for complete search history.

(56) References Cited

U.S. PATENT DOCUMENTS

| 6,233,290 B1* | 5/2001 | Raphaeli ............... H03M 13/39 375/262 |
| 6,785,837 B1* | 8/2004 | Kilmer et al. ............... 714/6.32 |
| 8,219,878 B1 | 7/2012 | Varnica et al. |
| 2006/0020872 A1* | 1/2006 | Richardson et al. ......... 714/758 |
| 2007/0186138 A1* | 8/2007 | Yang ................. H03M 13/2906 714/755 |
| 2008/0282129 A1 | 11/2008 | Blanksby |
| 2009/0164867 A1* | 6/2009 | Gray ..................... H03M 13/13 714/758 |
| 2010/0042904 A1 | 2/2010 | Gunnam |
| 2013/0080862 A1* | 3/2013 | Bennett ............... G06F 11/1076 714/782 |
| 2014/0281823 A1* | 9/2014 | Micheloni et al. ........... 714/773 |

* cited by examiner

*Primary Examiner* — Esaw Abraham
*Assistant Examiner* — Enam Ahmed
(74) *Attorney, Agent, or Firm* — Suiter Swantz pc llo

(57) ABSTRACT

A low-density parity-check decoder utilizes information about hard errors in a storage medium to identify bit locations to flip log-likelihood ratios while attempting to decode codewords. The decoder iteratively flips and saturates log-likelihood ratios for bits at hard error locations and re-decodes until a valid codeword is produced. The decoder also identifies variable nodes associated with trapping sets for iterative log-likelihood ratio bit flipping.

15 Claims, 4 Drawing Sheets

… (1)

PRIORI INFORMATION BASED POST-PROCESSING IN LOW-DENSITY PARITY-CHECK CODE DECODERS

PRIORITY

The present application claims the benefit under 35 U.S.C. §119(e) of U.S. Provisional Application Ser. No. 61/805,195, filed Mar. 26, 2013, which is incorporated herein by reference.

BACKGROUND OF THE INVENTION

Low density parity check codes are used in storage applications, including flash memory based storage controllers. Low density parity check decoders provides capability of soft decision decoding, which improves error rate performance compared to hard decision decoding. However, compared to conventional algebraic error correcting code schemes, low density parity check codes suffer from error floors which are known to be caused by trapping sets (near codewords) under commonly used iterative decoding algorithms. The error floor can be lowered by carefully reducing the number of harmful trapping sets in code construction.

In flash memory, defects (more generally hard errors) can trigger such trapping sets with much higher probability than in additive white Gaussian noise channels. Such hard errors leads to log-likelihood ratios that are saturated or almost saturated in the wrong direction (i.e., the sign of the log-likelihood ratio is wrong), which probabilistically triggers trapper sets in iterative decoding.

Consequently, it would be advantageous if an apparatus existed that is suitable for correcting or compensating for hard errors in low-density parity check decoding.

SUMMARY OF THE INVENTION

Accordingly, the present invention is directed to a novel method and apparatus for correcting or compensating for hard errors in low-density parity check decoding.

Embodiments of the present invention include post-processing techniques based on information pertaining to known hard error locations in a flash memory page and consequently in an error correcting code codeword. In a post-processing procedure, the processor or decoder flips signs of log-likelihood ratios for one or more such locations and re-decodes until convergence occurs.

In another embodiment of the present invention, the knowledge of hard error location is combined with decoder outputs such as unsatisfied checks after decoding failure. The processor or decoder flips signs of log-likelihood ratios for one or more locations that are both hard errors and connected to unsatisfied check, and re-decodes.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

Figure 1:
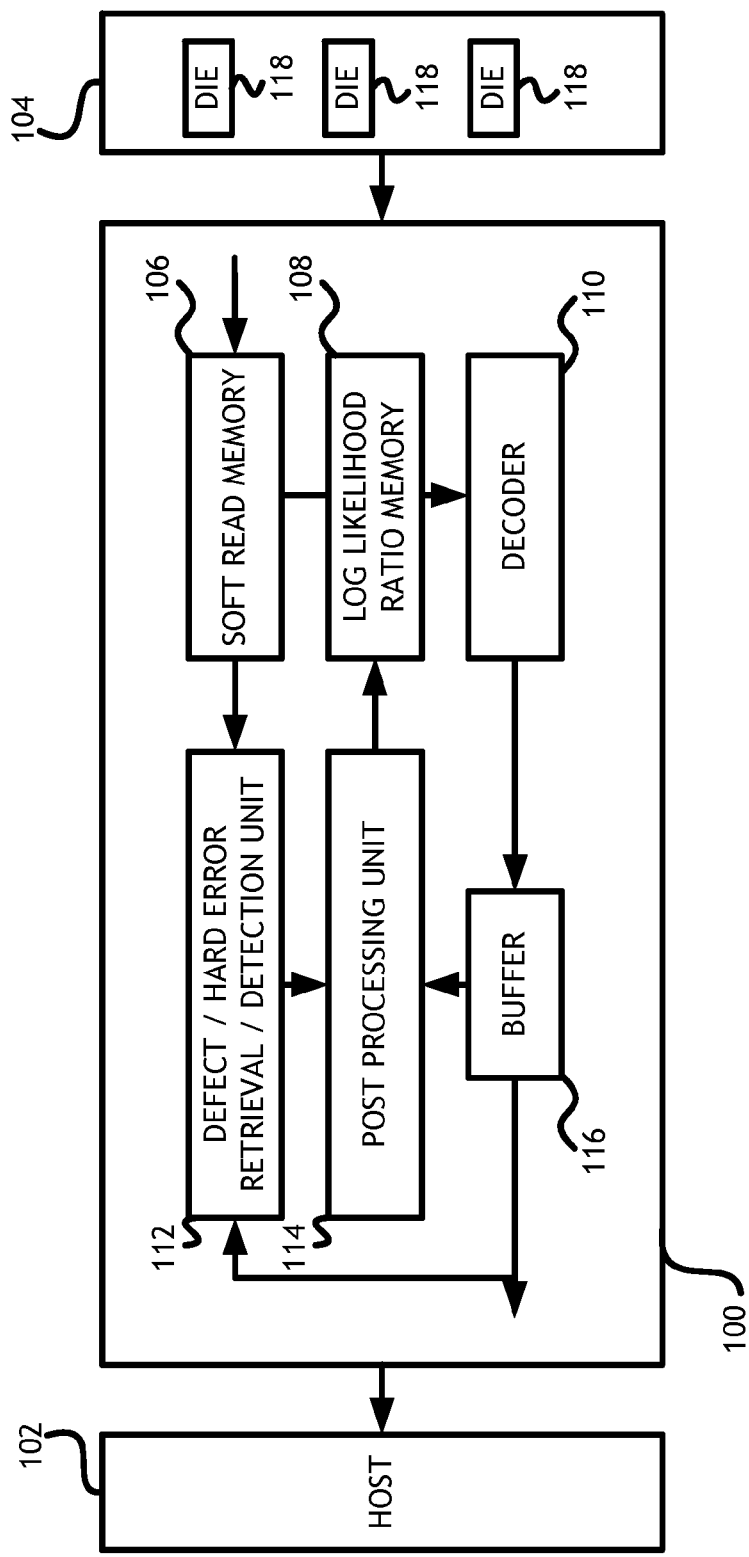
FIG. 1 shows a block diagram of a system for utilizing hard errors in post-processing.

Referring to FIG. 1, a block diagram of a system for utilizing hard errors in post-processing is shown. In at least one embodiment, the system includes a controller 100. In one embodiment, the controller 100 is a flash controller or some other solid-state drive controller. The controller 100 is connected to one or more memory devices 104, such as flash devices, each of the one or more memory devices 104 comprising one or more dies 118. The controller 100 receives data from the one or more memory devices 104 and sends decoded data to a host 102.

In at least one embodiment, the controller 100 includes a log-likelihood ratio memory 108 that stores log-likelihood ratios associated with various bits during decoding. The log-likelihood ratio memory 108 is connected to a decoder 110 that decodes low-density parity check codewords from the one or more memory devices 104, and where necessary uses log-likelihood ratios from the log-likelihood ratio memory 108 to determine bits most likely to have been erroneously decoded. In at least one embodiment, decoded bits from the decoder 110 are sent to a post-processing unit 114; in another embodiment, a post-processing unit 114 is incorporated into the decoded 110.

The post processing unit 114 erases one or more log-likelihood ratios associated with bits identified as hard error locations. With a priori information of hard error locations, the log-likelihood ratios for hard error bits can be erased before being sent to the decoder 110. Log-likelihood ratio values are erased because the true written value of that bit is unknown. Erasure decoding substantially lowers the error floor. However, when the number of hard errors (erasures) is large, the error floor may still be higher than required by the storage application. In at least one embodiment, hard error locations are identified by a hard error retrieval/detection unit 112. The hard error retrieval/detection unit 112 either receives hard error locations or identifies hard error locations based on inputs. In at least one embodiment, the hard error retrieval/detection unit 112 receives inputs such as raw codewords from a soft read memory 106 and decoded codewords from a codeword buffer 116 connected to the decoder 110. Hard error locations are identified using any means known in the art. For example, defects may be scanned at the time of manufacture and stored, so the controller 100 can retrieve them; or some random hard errors can be detected by decoding another page in the same wordline. A person skilled in the art may appreciate that any number of methods for detecting hard errors are available, and that any valid method for detecting hard errors can be used in embodiments of the present invention. After the post processing unit 114 erases one or more log-likelihood ratios associated with bits identified as hard error locations (sets the log-likelihood ratio to zero), the decoder 110 attempts to decode the codeword.

In at least one embodiment, if the decoder 110 fails to converge on a valid codeword after erasure, the post-processing unit 114 flips sign and saturates the log-likelihood ration associated with one of the hard error locations; that is to say, where the log-likelihood ratio indicates a high probability that the bit at a hard error location has been correctly decoded, the post-processing unit 114 switches the log-likelihood ratio to indicate a high uncertainty, or vice-versa. Because the error floor is hard error dominated, post-processing should be based on a priori knowledge of hard error locations if erasure decoding fails. Knowledge of hard error locations helps the controller 100 determine which log-likelihood ratios need to be flipped and saturated in magnitude before re-decoding trial.

The decoder 110 attempts to decode the codeword based on the flipped, saturated log-likelihood ratio. In at least one embodiment, the system iteratively flips and saturates log-likelihood ratios associated with hard error locations, and attempts to decode the codeword, until the decoder 110 converges on a valid codeword or all of the log-likelihood ratios associated with hard error locations have been flipped and saturated.

In at least one embodiment, if the decoder 110 fails to converge on a valid codeword after flipping and saturating all log-likelihood ratios associated with hard error locations, the system identifies all variable nodes associated with unsatisfied check nodes that are likely part of a trapping set. The post-processing unit 114 then iteratively flips log-likelihood ratios associated with those variable nodes and attempts to decode the codeword until a the decoder 110 converges on a valid codeword.

Figure 2:
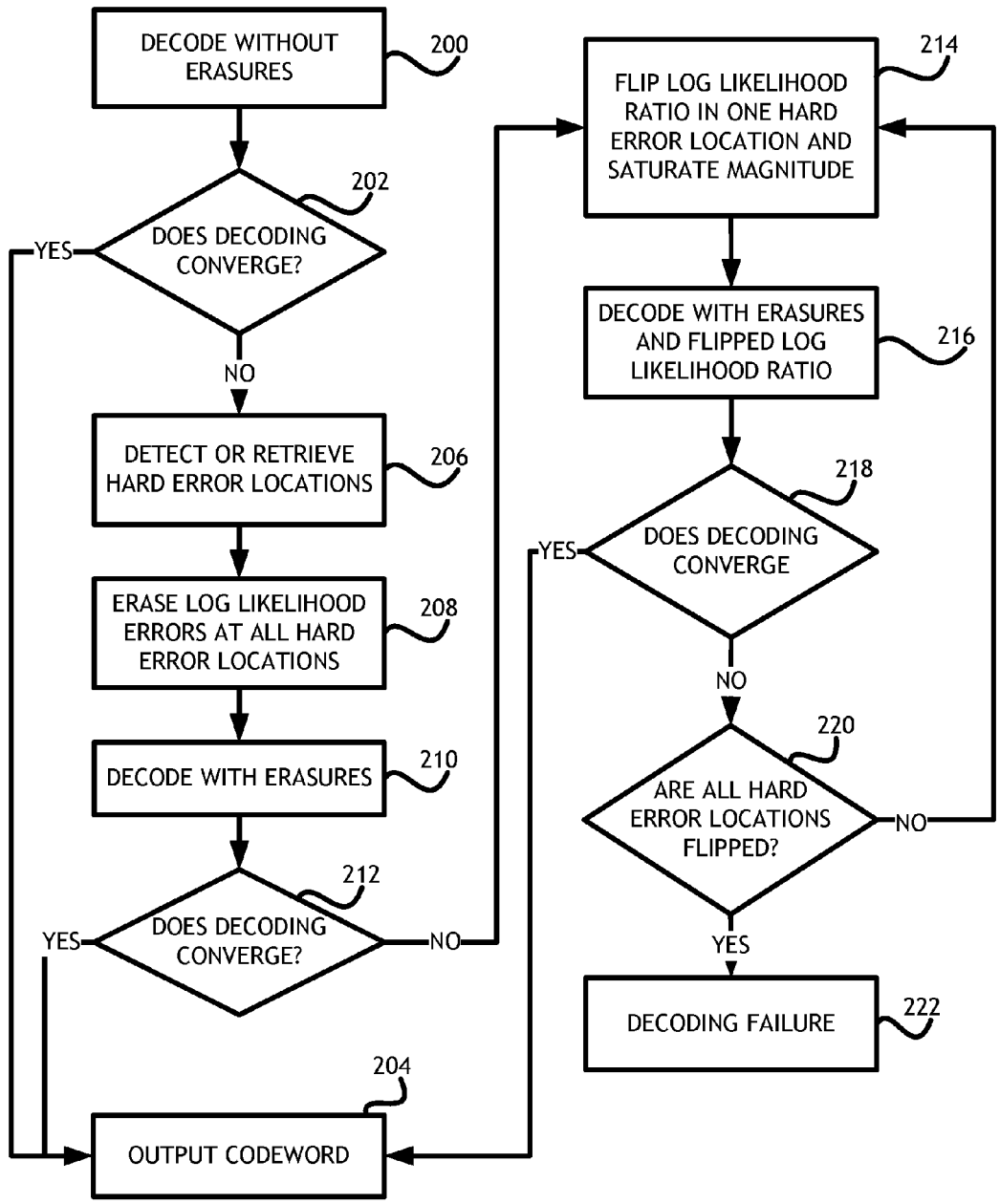
FIG. 2 shows a flowchart of a method for using hard error information without backtracking (utilizing unsatisfied check information after decoding failure) during low-density parity-check decoding.

Referring to FIG. 2, a flowchart of a method for using hard error information without backtracking (utilizing unsatisfied check information after decoding failure) during low-density parity-check decoding is shown. In at least one embodiment of the present invention, a low-density parity-check decoding processor decodes 200 a codeword. The processor determines 202 if the decoding process converges to a valid decoded word; if it does converge, the processor outputs 204 the word. If the decoding process does not converge, the processor detects or retrieves 206 hard error locations. Hard errors may be associated with a defect of the storage medium such as a stuck cell in a flash memory. The processor then erases 208 log-likelihood ratios associated with the hard error locations. The processor than attempts to decode 210 the codeword with those log-likelihood ratios erased (indicating complete uncertainty as to the value of the bits at those locations). The processor determines 212 if the decoding process converges to a valid decoded word; if the decoding process converges, the processor outputs 204 the word.

In at least one embodiment, if the decoding process does not converge, the processor selects a hard error location, then flips and saturates 214 the log-likelihood ratio associated with selected hard error location. The processor then decodes 216 the codeword and determines 218 if the decoding process converges to a valid decoded word; if the decoding process converges, the processor outputs 204 the word. Otherwise, the processor iteratively selects a different hard error location and continues to flip and saturate 214 the log-likelihood ratio associated with selected hard error locations until the processor determines 218 that the decoding process does converge, or determines 220 that all hard error locations have been flipped and decoded. If all hard error locations have been flipped without convergence, the processor indicates 222 a decoding failure. Embodiments of the present invention are orthogonal to existing post-processing methods that utilize unsatisfied check node information after a decoding failure. Therefore, embodiments of the present invention can be utilized along with existing methods to improve performance.

Figure 3:
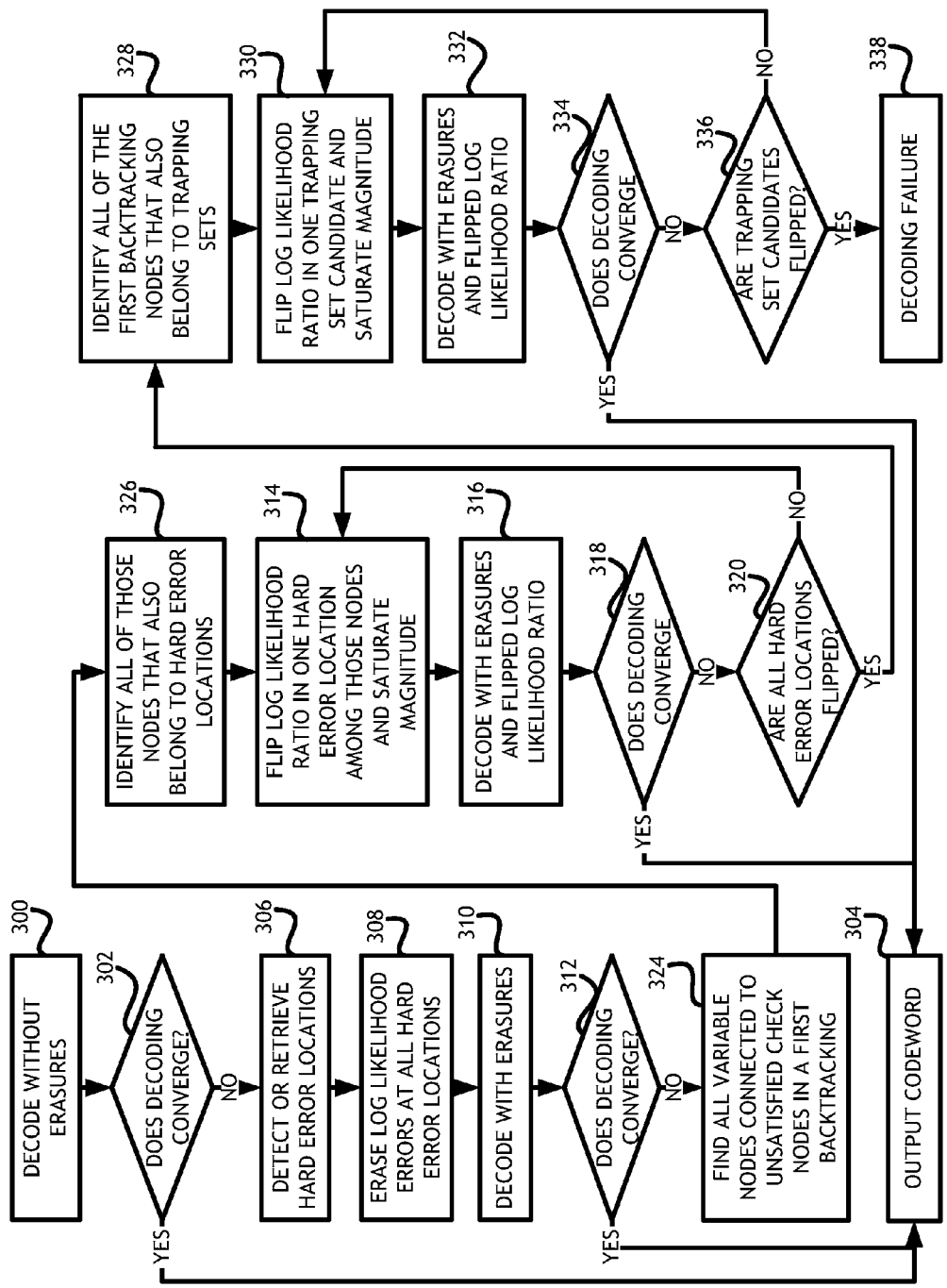
FIG. 3 shows a flowchart of a method for combining a priori hard error information with backtracking during low-density parity-check decoding.

Referring to FIG. 3, a flowchart of a method for combining a priori hard error information with backtracking during low-density parity-check decoding is shown. In at least one embodiment of the present invention, a low-density parity-check decoding processor decodes 300 a codeword. The processor determines 302 if the decoding process converges to a valid decoded word; if it does converge, the processor outputs 304 the word. If the decoding process does not converge, the processor detects or retrieves 306 hard error locations. Hard errors may be associated with a defect of the storage medium such as a stuck cell in a flash memory. The processor then erases 308 log-likelihood ratios associated with the hard error locations. The processor than attempts to decode 310 the codeword with those log-likelihood ratios erased (indicating complete uncertainty as to the value of the bits at those locations). The processor determines 312 if the decoding process converges to a valid decoded word; if the decoding process converges, the processor outputs 304 the word.

In at least one embodiment, if the decoding process does not converge, the processor identifies 324 all variable nodes connected to unsatisfied check nodes, and identifies 326 all of those variable nodes that also belong to hard error locations. The processor selects a hard error location associated with one of those variable nodes, then flips and saturates 314 the log-likelihood ratio associated with selected hard error location. The processor then decodes 316 the codeword and determines 318 if the decoding process converges to a valid decoded word; if the decoding process converges, the processor outputs 304 the word. Otherwise, the processor determines 320 if all of the identified hard error locations have been flipped; if not, the processor iteratively selects a different hard error location and continues to flip and saturate 314 the log-likelihood ratio associated with selected hard error locations until the processor determines 318 that the decoding process does converge, or determines 320 that all hard error locations have been flipped and decoded. Such methods are orthogonal to post-processing methods known in the art, and can be combined with those methods.

In at least one embodiment, if all hard error locations have been flipped and the decoder does not converge, the processor begins backtracking, and identifies 328 all of the variable nodes associated with unsatisfied check nodes that also belong to trapping sets. The processor selects one of those variable nodes, then flips and saturates 330 the log-likelihood ratio associated with selected variable node. The processor then decodes 332 the codeword and determines 334 if the decoding process converges to a valid decoded word; if the decoding process converges, the processor outputs 304 the word. Otherwise, the processor determines 336 if all of the identified variable nodes have been flipped; if not, the processor iteratively selects a different variable node and continues to flip and saturate 330 the log-likelihood ratio associated with selected variable node until the processor determines 334 that the decoding process does converge, or determines 336 that all potential variable nodes have been flipped and decoded, in which case the processor indicates 338 a decoding failure.

Figure 4:
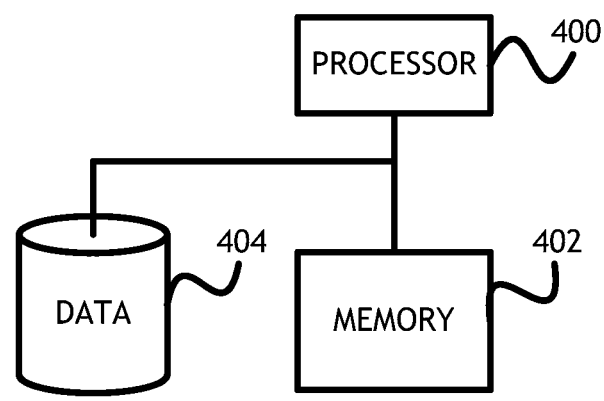
FIG. 4 shows a block diagram of a system useful in embodiments of the present invention.

Referring to FIG. 4, a block diagram of a system useful in embodiments of the present invention is shown. The system, such as a data storage system, includes a processor 400, memory 402 connected to the processor 400 and a data storage element 404 connected to the processor 400. In at least one embodiment, were the data storage element 404 stores data encoded by a low-density parity-check code, the processor 400 is configured to decode the data and identify hard errors such as defect in the data storage element 404.

In at least one embodiment, processor 400 decodes a codeword from the data storage element 404. The processor 400 determines if the decoding process converges to a valid decoded word; if it does converge, the processor 400 outputs 304 the word. If the decoding process does not converge, the processor 400 detects or retrieves hard error locations. The processor 400 then erases log-likelihood ratios associated with the hard error locations. The processor 400 than attempts to decode the codeword with those log-likelihood ratios erased (indicating complete uncertainty as to the value of the bits at those locations). The processor 400 determines if the decoding process converges to a valid decoded word; if the decoding process converges, the processor 400 outputs the word.

In at least one embodiment, if the decoding process does not converge, the processor 400 identifies all variable nodes connected to unsatisfied check nodes, and identifies all of those variable nodes that also belong to hard error locations. The processor 400 then iteratively selects hard error locations associated with one of the variable nodes, flips and saturates 314 the log-likelihood ratio associated with selected hard error location, and decodes the codeword until the process converges on a valid codeword or all of the identified hard error locations have been flipped.

In at least one embodiment, if all hard error locations have been flipped without convergence, the processor 400 identifies all of the variable nodes associated with unsatisfied check nodes that also belong to trapping sets. The processor 400 iteratively selects one of those variable nodes, flips and saturates 330 the log-likelihood ratio associated with selected variable node and decodes the codeword until the decoding process converges to a valid decoded word or all of the identified variable nodes have been flipped.

It is believed that the present invention and many of its attendant advantages will be understood by the foregoing description of embodiments of the present invention, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A memory storage system, comprising:
   a processor;
   memory connected to the processor;
   a data storage element connected to the processor; and
   non-transitory computer executable program code embodied in the memory, configured to execute on the processor,
   wherein the computer executable program code is configured to:
   receive a low-density parity-check encoded codeword;
   identify one or more variable nodes associated with one or more unsatisfied check nodes in the codeword;
   identify all backtracking nodes also belonging to trapping sets;
   identify one or more backtracking nodes based on a probability that each of the one or more variable nodes belongs to a trapping set of a low-density parity-check code;
   select one of the backtracking nodes;
   flip a log-likelihood ratio associated with the selected backtracking node;
   saturate a magnitude of the log-likelihood ratio associated with the selected backtracking node;
   detect two or more hard error locations associated with bits in the codeword;
   erase multiple log-likelihood ratios associated with the detected hard error locations; and
   decode the codeword based on the erased log-likelihood ratios.

2. The memory storage system of claim 1, wherein the computer executable program code is further configured to receive a list of one or more hard error locations associated with a bit in a codeword.

3. The memory storage system of claim 1, wherein the computer executable program code is further configured to:
   select a log-likelihood ratio associated with a hard error location in the two or more hard error locations; and
   saturate the selected log-likelihood ratio.

4. The memory storage system of claim 1, wherein the computer executable program code is further configured to flip each log-likelihood ratio associated with the hard error locations during a post-processing procedure after an erasure decoding failure.

5. The memory storage system of claim 1, wherein the computer executable program code is further configured to:
   identify one or more variable nodes associated with one or more unsatisfied check nodes in the codeword;
   identify one or more trapping set variable nodes from the one or more variable nodes based on a probability that each of the one or more variable nodes belongs to a trapping set of a low-density parity-check code;
   select one of the trapping set variable nodes;
   flip a log-likelihood ratio associated with the selected trapping set variable node; and
   decode the codeword.

6. A method for decoding low-density parity-check encoded words, comprising:
   identifying one or more hard error locations associated with bits in a codeword;
   selecting one hard error location;
   erasing a log-likelihood ratio associated with the selected hard error location;
   decoding the codeword based on the erased log-likelihood ratio;
   identifying one or more variable nodes associated with one or more unsatisfied check nodes in the codeword;
   identifying all backtracking nodes also belonging to trapping sets;
   identifying one or more backtracking nodes based on a probability that each of the one or more variable nodes belongs to a trapping set of a low-density parity-check code;
   selecting one of the backtracking nodes;
   flipping a log-likelihood ratio associated with the selected backtracking node;
   saturating a magnitude of the log-likelihood ratio associated with the selected backtracking node; and
   decoding the codeword.

7. The method of claim 6, further comprising receiving a list of one or more hard error locations associated with a bit in a codeword.

8. The method of claim 6, further comprising saturating the log-likelihood ratio.

9. The method of claim 6, further comprising:
iteratively selecting a previously unselected hard error location;
flipping a log-likelihood ratio associated with the previously unselected hard error location; and
decoding the codeword based on the modified log-likelihood ratio.

10. The method of claim 9, further comprising saturating the log-likelihood ratio.

11. The computer apparatus of claim 10, further comprising:
iteratively selecting a previously unselected trapping set variable node from the one or more trapping set variable nodes;
flipping a log-likelihood ratio associated with the previously unselected trapping set variable node; and
decoding the codeword based on the modified log-likelihood ratio.

12. A computer apparatus, comprising:
a processor; and
non-transitory computer executable program code embodied in a memory, configured to execute on the processor,
wherein the computer executable program code is configured to:
identify one or more hard error locations associated with bits in a low-density parity-check codeword;
detect two or more hard error locations associated with bits in the codeword;
erase multiple log-likelihood ratios associated with the detected hard error locations;
decode the codeword based on the erased log-likelihood ratios
identify one or more variable nodes associated with one or more unsatisfied check nodes in the codeword;
identify all backtracking nodes also belonging to trapping sets;
identify one or more backtracking nodes based on a probability that each of the one or more variable nodes belongs to a trapping set of a low-density parity-check code;
select one of the backtracking nodes;
flip a log-likelihood ratio associated with the selected backtracking node;
saturate a magnitude of the log-likelihood ratio associated with the selected backtracking node; and
decode the codeword.

13. The computer apparatus of claim 12, wherein the computer executable program code is further configured to flip the log-likelihood ratios associated with the detected hard error locations during a post-processing procedure after an erasure decoding failure.

14. The computer apparatus of claim 12, wherein and the computer executable program code is further configured to:
select a log-likelihood ratio associated with a hard error location in the two or more hard error locations; and
saturate the log likelihood ratio.

15. The computer apparatus of claim 12, wherein the computer executable program code is further configured to:
iteratively select a previously unselected trapping set variable node from the one or more trapping set variable nodes;
flip a log-likelihood ratio associated with the previously unselected trapping set variable node; and
decode the codeword based on the flipped log-likelihood ratio.

* * * * *